(12) United States Patent
Lee et al.

(10) Patent No.: US 12,408,297 B2
(45) Date of Patent: Sep. 2, 2025

(54) LIQUID-COOLING SYSTEM INCLUDING MONITORING AND ALERTING MODULE, MONITORING AND ALERTING METHOD FOR LIQUID-COOLING SYSTEM, AND ELECTRONIC DEVICE INCLUDING THE SAME

(71) Applicant: WISTRON CORP., New Taipei (TW)

(72) Inventors: Chih Cheng Lee, New Taipei (TW); Tzu-Wei Gu, New Taipei (TW); Chun-Chieh Huang, New Taipei (TW); Yu-Lin Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 203 days.

(21) Appl. No.: 18/310,578

(22) Filed: May 2, 2023

(65) Prior Publication Data

US 2024/0188251 A1 Jun. 6, 2024

(30) Foreign Application Priority Data

Dec. 2, 2022 (TW) .................................. 111146348

(51) Int. Cl.
*H05K 7/20* (2006.01)
*G08B 21/18* (2006.01)

(52) U.S. Cl.
CPC ....... *H05K 7/20272* (2013.01); *G08B 21/182* (2013.01); *H05K 7/20254* (2013.01); *H05K 7/20763* (2013.01)

(58) Field of Classification Search
CPC .................................................. H05K 7/20272
See application file for complete search history.

(56) References Cited

U.S. PATENT DOCUMENTS

| | | | |
|---|---|---|---|
| 11,174,033 B2 * | 11/2021 | Chopard | ............... B32B 15/085 |
| 2013/0128918 A1 * | 5/2013 | Campbell | .......... H05K 7/20836 374/57 |
| 2014/0027089 A1 | 1/2014 | Hisada | |
| 2020/0367320 A1 * | 11/2020 | Oka | .................. H01L 21/67011 |
| 2021/0173457 A1 | 6/2021 | Chen | |

FOREIGN PATENT DOCUMENTS

CN 103493612 A 1/2014

OTHER PUBLICATIONS

TW Office Action dated Jul. 10, 2023 in Taiwan application No. 111146348.

* cited by examiner

*Primary Examiner* — Travis R Hunnings
(74) *Attorney, Agent, or Firm* — McClure, Qualey & Rodack, LLP (57) ABSTRACT

A monitoring and alerting method for a liquid-cooling system includes monitoring a thermal resistance variation of a cold plate of the liquid-cooling system and sending an alert related to the thermal resistance variation. Furthermore, a liquid-cooling system and an electronic device including the same are provided. The liquid-cooling system includes a liquid-cooling module including a cold plate; and a monitoring and alerting module including a control unit, an inlet thermometer in communication with the control unit for measuring a temperature of a liquid inlet of the cold plate, and a heat source thermometer in communication with the control unit for measuring a temperature of a heat source in thermal contact with the cold plate. The control unit produces an alert according to a thermal resistance variation calculated by the inlet thermometer, the heat source thermometer, and a power of the heat source.

20 Claims, 8 Drawing Sheets calculating thermal resistance — S11 determining whether to produce alert according to thermal resistance variation — S12

LIQUID-COOLING SYSTEM INCLUDING MONITORING AND ALERTING MODULE, MONITORING AND ALERTING METHOD FOR LIQUID-COOLING SYSTEM, AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 111146348 filed in Taiwan (R.O.C.) on Dec. 2, 2022, the entire contents of which are hereby incorporated by reference.

TECHNICAL FIELD

The disclosure relates to a monitoring and alerting module and a monitoring and alerting method for liquid-cooling system and an electronic device including the same.

BACKGROUND

With the advancement of technologies related to lot and big data, electronic devices, such as notebook computers, desktop computers, servers, have become an indispensable part of daily life. To prevent high temperature caused by internal elements within these devices from affecting the performance, liquid cooling is known a more effective solution compared to air cooling.

Typically, a liquid-cooling system may include one or more cold plates, tubing connected to the cold plates (cold plate), and a pump to enable a coolant flowing through the cold plates and tubing. The coolant is pumped to pass through the cold plates so as to take away the heat generated by heat source being in contact with the cold plates.

It is known that coolant leakage will directly affect the capacity of the liquid-cooling system to cool down the heat source. However, conventionally, the leakage detectors are arranged on the circuit board or tubing which located underneath the cooling loop, thus when the user receive the alert from the detector, the damages that causes the coolant leakage and the lost resulted from the coolant leakage may be already existing for a long time. As a result, the user has to stop the operation without preparation in advance and therefore easily causes great lost.

In addition, even if there is no coolant leakage, the liquid-cooling system still may have other issues that will affect the cooling capacity. For example, corrosion on the inner surface of the tubing due to coolant, accumulation of debris due to the impact that the bubbles flowing in the coolant acts on the tubes, and/or abnormally bending of tubing, the above issues all may gradually affect the cooling capacity of the liquid-cooling system and eventually lead to malfunction of the liquid-cooling system. According to some actual analysis reports, the above issues may appear at least one month earlier than the system determines that the heat source is overheating.

SUMMARY

Accordingly, one aspect of the disclosure is to provide a liquid-cooling system, a monitoring and alerting method, and an electronic device which are capable of enabling timely alerting when or even before unwanted factors appears in liquid-cooling system.

One embodiment of the disclosure provides a monitoring and alerting method for a liquid-cooling system including monitoring a thermal resistance variation of at least one cold plate of the liquid-cooling system and sending an alert related to the thermal resistance variation.

Another embodiment of the disclosure provides a liquid-cooling system including a liquid-cooling module comprising at least one cold plate and a monitoring and alerting module comprising a control unit, a first inlet thermometer, and a first heat source thermometer. The first inlet thermometer is in communication with the control unit for measuring a temperature of a liquid inlet of the at least one cold plate, the first heat source thermometer is in communication with the control unit for measuring a temperature of at least one heat source in thermal contact with the at least one cold plate. The control unit produces an alert according to a thermal resistance variation calculated by the first inlet thermometer, the first heat source thermometer, and a power of the at least one heat source.

Another embodiment of the disclosure provides an electronic device including a circuit board, at least one heat source disposed on the circuit board, a liquid-cooling module comprising at least one cold plate in thermal contact with the at least one heat source, and a monitoring and alerting module comprising a control unit, a first inlet thermometer, and a first heat source thermometer, the control unit is electrically connected to the circuit board, the first inlet thermometer is in communication with the control unit for measuring a temperature of a liquid inlet of the at least one cold plate, the first heat source thermometer is in communication with the control unit for measuring a temperature of the at least one heat source. The control unit produces an alert according to a thermal resistance variation calculated by the first inlet thermometer, the first heat source thermometer, and a power of the at least one heat source.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
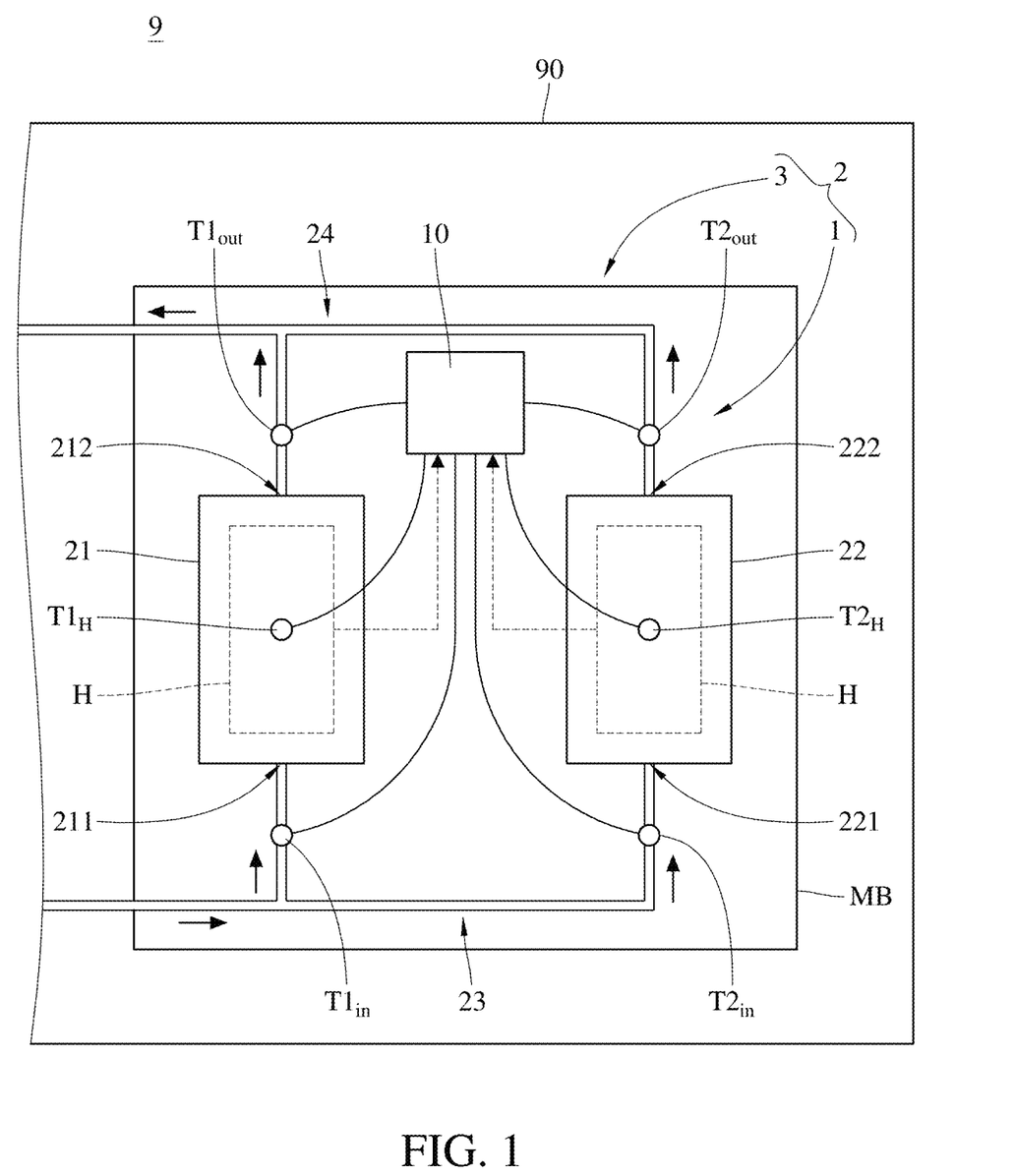
FIG. 1 is a schematic view of a liquid-cooling system having a monitoring and alerting module according to one embodiment of the disclosure.

Firstly, referring to FIG. 1, one embodiment of the disclosure provides an electronic device 9 with a liquid-cooling system 2. The electronic device 9 may be, but is not limited to, a computer host, server, or a part thereof. The electronic device 9 may include a device casing 90 configured to support or accommodate one or more electronic components H (also called "heat source H") needed to be cooled when operating. The liquid-cooling system 2 may include a liquid-cooling module 3 configured for cooling the heat source of the electronic device 9 and a monitoring and alerting module 1 provided for monitoring the liquid-cooling module 3. The liquid-cooling module 3 may be arranged on the device casing 90. The liquid-cooling module 3 is configured to thermal contact the heat source H and therefore can cool the heat source H. The monitoring and alerting module 1 may be arranged on the device casing 90. The monitoring and alerting module 1 may receive (or, capture) and calculate values related to the liquid-cooling module 3 and the heat source H so that monitoring and alerting module 1 is able to timely alert user about an unwanted variation of the cooling capacity of the liquid-cooling module 3 before the situation get worse. This allows user to be able to find out the potential problems that affects the cooling capacity as early as possible. Note that the device casing 90 may accommodate or support other electronic/non-electronic components as required.

In this embodiment, the liquid-cooling module 3 may include a first cold plate 21 and a second cold plate 22. The heat source H may be disposed on a circuit board (mainboard) MB of the device casing 90. The first cold plate 21 and the second cold plate 22 may be disposed on the circuit board MB and are in thermal contact with the heat source H. Specifically, the first cold plate 21 and the second cold plate 22 may be secured to the circuit board MB in a way that allows the first cold plate 21 and the second cold plate 22 to be stacked on and in thermal contact with the heat source H. In some embodiments, the heat source H may be a central processing unit. The liquid-cooling module 3 may further include a liquid inlet tube 23 and a liquid outlet tube 24. The liquid inlet tube 23 may be in fluid communication with the liquid inlet 211 of the first cold plate 21 and the liquid inlet 221 of the second cold plate 22. The liquid outlet tube 24 may be in fluid communication with the liquid outlet 212 of the first cold plate 21 and the liquid outlet 222 of the second cold plate 22.

As such, a coolant (not shown) flowing through the liquid-cooling module 3 is allowed to flow into the first cold plate 21 and the second cold plate 22 via the liquid inlet tube 23, take away from the heat generated by the heat source H from the first cold plate 21 and the second cold plate 22, and to flow out of the first cold plate 21 and the second cold plate 22 via the liquid outlet tube 24. The coolant flowing out of the liquid outlet tube 24 may be cooled using any suitable means (not shown) and then pumped back into the liquid inlet tube 23 to realize a cooling circulation.

In this embodiment, the monitoring and alerting module 1 may include a control unit 10. The control unit 10 may be, but is not limited to, a board management controller (BMC). The control unit 10 may be electrically connected to the circuit board MB of the electronic device 9. In some embodiments, the control unit 10 may be disposed on the circuit board MB of the electronic device 9; in some other embodiments, the control unit 10 is not disposed on the circuit board MB and may be in wired or wireless communication with the circuit board MB via any suitable means.

In this embodiment, the monitoring and alerting module 1 may further include at least one temperature sensor (e.g., a first inlet thermometer $T1_{in}$, a second inlet thermometer $T2_{in}$, a first outlet thermometer $T1_{out}$, and a second outlet thermometer $T2_{out}$). The first inlet thermometer $T1_{in}$, the second inlet thermometer $T2_{in}$, the first outlet thermometer $T1_{out}$, and the second outlet thermometer $T2_{out}$ may be any temperature sensor that is capable of measuring the temperature of the coolant, such as a resistance temperature device (RTD), but the disclosure is not limited thereto. The first inlet thermometer $T1_{in}$, the second inlet thermometer $T2_{in}$, the first outlet thermometer $T1_{out}$, and the second outlet thermometer $T2_{out}$ may be in wired or wireless communication with the control unit 10 via, for example, the circuit board MB or any other suitable means and therefore they can transmit temperature related values to the control unit 10 and/or receive instruction from the control unit 10.

As shown, the first inlet thermometer $T1_{in}$ may be disposed on the liquid inlet tube 23 and located relatively close to the liquid inlet 211 of the first cold plate 21, the second inlet thermometer $T2_{in}$ may be disposed on the liquid inlet tube 23 and located relatively close to the liquid inlet 221 of the second cold plate 22, the first outlet thermometer $T1_{out}$ may be disposed on the liquid outlet tube 24 and located relatively close to the liquid outlet 212 of the first cold plate 21, and the second outlet thermometer $T2_{out}$ may be disposed on the liquid outlet tube 24 and located relatively close to the liquid outlet 222 of the second cold plate 22. As such, with the first inlet thermometer $T1_{in}$, the second inlet thermometer $T2_{in}$, the first outlet thermometer $T1_{out}$, and the second outlet thermometer $T2_{out}$, the control unit 10 is able to monitor, record, and analyze the temperature and temperature variation of the coolant flowing into and out of the first cold plate 21 and the second cold plate 22.

In addition, the control unit 10 may be in wired or wireless communication with other temperature sensors (e.g., a first heat source thermometer $T1_H$ and a second heat source thermometer $T2_H$) via, for example, the circuit board MB or any other suitable means. The first heat source thermometer $T1_H$ and the second heat source thermometer $T2_H$ may be any temperature sensor that is capable of measuring the temperature of the heat source. With the first heat source thermometer $T1_H$ and the second heat source thermometer $T2_H$, the control unit 10 is able to monitor, record, and analyze the temperature and temperature variation of the heat sources H being in thermal contact with the first cold plate 21 and the second cold plate 22. In addition, since the control unit 10 is in communication with the circuit board MB, the control unit 10 is able to obtain the current power (Watt) of the heat sources H being in thermal contact with the first cold plate 21 and the second cold plate 22.

Accordingly, the monitoring and alerting module 1 is able to obtain the temperature values of the liquid inlets and the liquid outlets of the first cold plate 21 and the second cold plate 22 and the temperature and power values of the heat sources H being in thermal contact with the first cold plate 21 and the second cold plate 22. As such, the monitoring and alerting module 1 is able to calculate and analyze a thermal resistance $R_{cal}$ (unit: ° C./W) of the liquid-cooling module 3. Specifically, the monitoring and alerting module 1 is able to obtain a thermal resistance (denotes to $R_{cal,1}$) at the first cold plate 21 and a thermal resistance (denotes to $R_{cal,2}$) at the second cold plate 22, while the monitoring and alerting module 1 keeps monitoring and recording the thermal resistances about the first cold plate 21 and the second cold plate 22, the monitoring and alerting module 1 is able to obtain a variation of the thermal resistance of the first cold plate 21 and/or the second cold plate 22. Also, the monitoring and alerting module 1 is able to derive a mass flowrate $m_{cal,1}$ (unit: kg/s) at the first cold plate 21 and a mass flowrate $m_{cal,2}$ at the second cold plate 22 based on the obtained values and therefore is able to derive the variation of a flow rate ratio $\delta_{cal}$ of the first cold plate 21 and the second cold plate 22. By doing so, the monitoring and alerting module 1 is able to determine whether the flow rate of the coolant that the liquid-cooling module 3 provides to the first cold plate 21 and/or the second cold plate 22 has any deviation (e.g., continuously ascending or continuously descending) that is necessary to alert user. This makes the user able to aware that there may be a potential problem that may affect the cooling capacity of the liquid-cooling module 3 as early as possible. In other words, with the monitoring and alerting module 1, the user would have a chance to deal with or solve the factor that affects the cooling capacity before it becomes a serious problem.

Generally, the factors that may affect the cooling capacity of the liquid-cooling module 3 may include: coolant leakage due to tubing damage, corrosion on the inner surface of the tubing due to coolant, accumulation of debris due to the impact that the bubbles flowing in the coolant acts on the tubes, and/or abnormally bending of tubing. Specifically, coolant leakage will gradually decreases the flow rate of the coolant circulation; an accumulation of debris or impurities will gradually lead to blockage; and an abnormally bending tubing may significantly reduce the size of the channel for the coolant. All of the situations will decrease the flow rate of the coolant passing through the first cold plate 21 and the second cold plate 22 over time and thereby affecting the cooling capacity of the liquid-cooling module 3 to the heat sources H. The monitoring and alerting module 1 is able to obtain specific values (e.g., thermal resistance and flow rate ratio) to determine whether the aforementioned problems occurs as early as possible, thereby capable of sending out an alert for the user to conduct precaution steps before the performance of the liquid-cooling module 3 goes down to an unacceptable level.

Figure 2A:
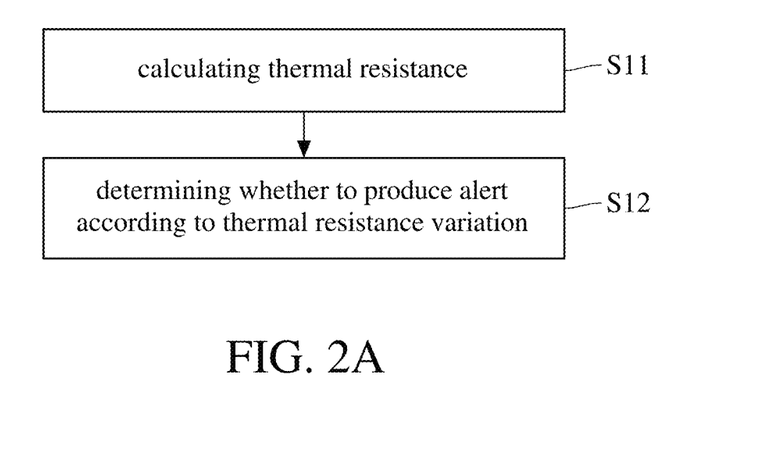
FIGS. 2A-2B are flow charts showing steps of a monitoring and alerting method according to one embodiment of the disclosure that involve thermal resistance.
Figure 2B:
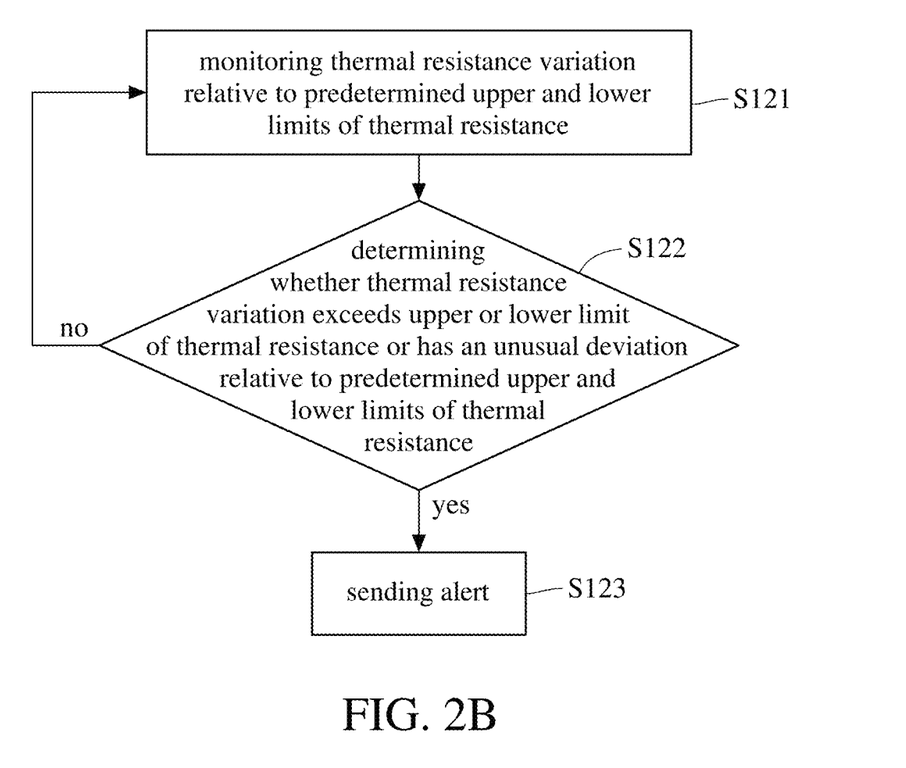

Please refer to FIGS. 2A-2B, flow charts about how the control unit 10 of the monitoring and alerting module 1 uses a monitoring and alerting method to monitor and alert situations related to thermal resistance are provided. As shown, the monitoring and alerting method performed by the control unit 10 may include: step S11 (calculating thermal resistance) and step S12 (determining whether to produce alert according to thermal resistance variation).

In step S11, a thermal resistance $R_{cal}$ of one of the cold plates may be derived from a cold plate inlet temperature $T_{in}$, a cold plate outlet temperature $T_{out}$, a heat source temperature $T_H$, and a heat source power $P_H$ obtained by the monitoring and alerting module 1, where the thermal resistance $R_{cal}$ can be expressed as: $R_{cal}=(T_H-T_{in})/P_H$.

Regarding the monitoring at the first cold plate 21 of the liquid-cooling module 3, the temperature (i.e., the inlet temperature of the first cold plate 21, expressed as: $T_{in,1}$) of the coolant flowing into the first cold plate 21 can be measured by the first inlet thermometer $T1_{in}$, the temperature (i.e., the outlet temperature of the first cold plate 21, expressed as: $T_{out,1}$) of the coolant flowing out of the first cold plate 21 can be measured by the first outlet thermometer $T1_{out}$, the temperature ($T_{H,1}$) of the heat source H being in thermal contact with the first cold plate 21 can be measured by the first heat source thermometer $T1_H$, and the power ($P_{H,1}$) of the heat source H being in thermal contact with the first cold plate 21 can be obtained from the circuit board MB. From this point on, a thermal resistance $R_{cal,1}$ at the first cold plate 21 can be derived from the following expression:

$$R_{cal,1}=(T_{H,1}-T_{in,1})/P_{H,1}.$$

Through similar manner, the control unit 10 may derive a thermal resistance $R_{cal,2}$ at the second cold plate 22 using the following expression:

$$R_{cal,2}=(T_{H,2}-T_{in,2})/P_{H,2}$$

where $T_{H,2}$ is the temperature of the heat source H being in thermal contact with the second cold plate 22 which is measured by the second heat source thermometer $T2_H$, $T_{in,2}$ is the temperature (i.e., the inlet temperature of the second cold plate 22) of the coolant flowing into the second cold plate 22 which is measured by the second inlet thermometer $T2_{in}$, and $P_{H,2}$ is the power of the heat source H being in thermal contact with the second cold plate 22 which is obtained from the circuit board MB.

In addition, a predetermined upper limit of thermal resistance $R_{spec,\ max}$ and a predetermined lower limit of thermal resistance $R_{spec,\ min}$ which are used for determining the variation trend of the $R_{cal,1}$ and $R_{cal,2}$ may be provided to the control unit 10 or pre-stored in the control unit 10. $R_{spec,\ max}$ and $R_{spec,\ min}$ may be user-defined values which consider the cooling capacity needed by the heat source H under different flow rates. $R_{spec,\ max}$ and $R_{spec,\ min}$ may, but are not limited to, have a specific ratio to the flow rate.

For example, $R_{spec}$ may be expressed as:

$$R_{spec}=\alpha \times Q^\beta$$

where $R_{spec}$ is a user-defined specification about thermal resistance, $\alpha$ and $\beta$ are user-defined values, Q is the flow rate at the cold plate.

From this point on, a predetermined upper limit of thermal resistance $R_{spec,\ max}$ may be expressed as:

$$R_{spec,max} = \alpha_{max} \times Q^{\beta_{max}}$$

where $\alpha_{max}$ and $\beta_{max}$ respectively are maximum values of $\alpha$ and $\beta$;

A predetermined lower limit of thermal resistance $R_{spec,\ min}$ may be expressed as:

$$R_{spec,min} = \alpha_{min} \times Q^{\beta_{min}}$$

where $\alpha_{min}$ and $\beta_{min}$ respectively are minimum values of the $\alpha$ and $\beta$.

An example of $\alpha_{max}$, $\beta_{max}$, $\alpha_{min}$, and $\beta_{min}$ are given in table 1:

TABLE 1

| thermal resistance | α | β |
|---|---|---|
| maximum value | 0.045 | −0.655 |
| minimum value | 0.051 | −0.711 |

It is noted that the actual values of $R_{spec}$, $R_{spec,\ max}$, and $R_{spec,\ min}$ and the ratio thereamong may be modified as required and not intended to limit the disclosure.

Then, in step S12, the monitoring and alerting module 1 may determine whether to produce an alert according to the thermal resistance variation. Considering that the thermal resistance of the liquid-cooling module 3 during the actual operation of the electronic device 9 may still have an increase or decrease naturally caused by the power variation of the heat source and/or the flow of coolant even if the aforementioned factors (tubing damage, presence of impurities or debris accumulation, or abnormally bending tube) that affect the cooling capacity of the liquid-cooling module 3 do not appear yet, the monitoring and alerting module 1 may focus on monitoring the appearance of specific trend of the thermal resistance variation.

For example, when an unusual deviation (e.g., gradual increasing or a sudden increase) of the thermal resistance in a specific period of time, the monitoring and alerting module 1 will produce an alert to warn the user. In other words, the monitoring and alerting module 1 may determine whether the trend of the thermal resistance of the liquid-cooling system 3 over a specific period of time appears a situation needed to alert the user. The situation needed to alert the user may be caused by factors that may affect the cooling capacity of the liquid-cooling module 3 (e.g., tubing damage, debris of impurities accumulation, and/or abnormally bending tube).

Specifically shown in FIG. 2B, step S12 may include step S121 (monitoring the thermal resistance variation relative to the predetermined upper limit of thermal resistance $R_{spec,\ max}$ and the predetermined lower limit of thermal resistance $R_{spec,\ min}$) and step S122 (determining whether thermal resistance variation exceeds $R_{spec,\ max}$ or $R_{spec,\ min}$ or has an unusual deviation relative to $R_{spec,\ max}$ and $R_{spec,\ min}$).

Figure 3:
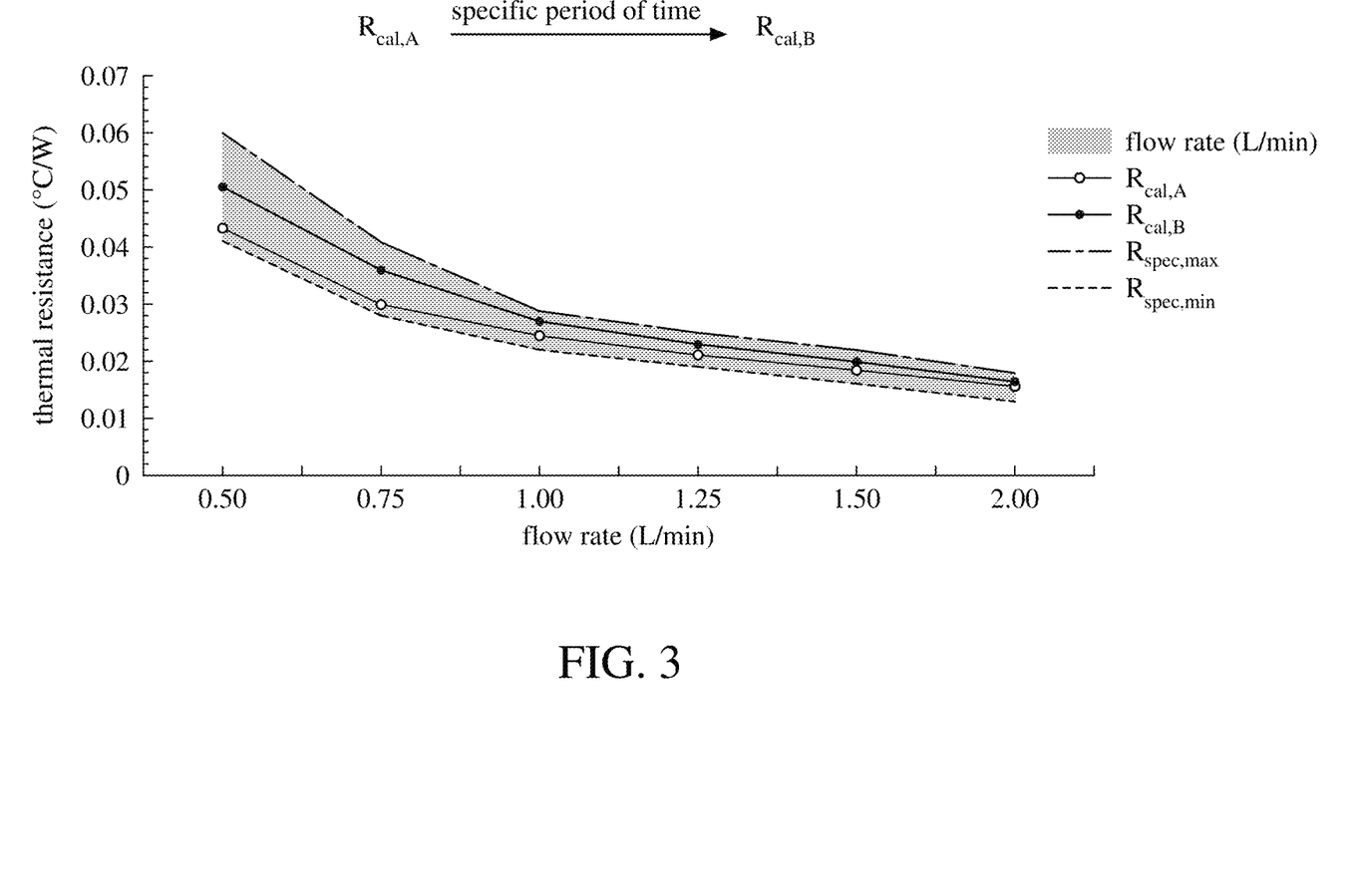
FIG. 3 is a curve chart of thermal resistance with flow rate of one of cold plates in the liquid-cooling system in FIG. 1.

Firstly, in step S121, referring to FIG. 3, a curve chart related to thermal resistance with flow rate at the first cold plate 21 of the liquid-cooling module 3 is given for illustrating step S121. As shown, $R_{cal,A}$ is a curve line of thermal resistance with flow rate at the first cold plate 21 during an early stage of the operation of the liquid-cooling module 3, $R_{cal,B}$ is a curve line of thermal resistance with flow rate at the first cold plate 21 when the liquid-cooling module 3 has operated over a specific period of time (e.g., over a month), and the gray color area is defined by $R_{spec,\ max}$ and $R_{spec,\ min}$ to show a proper range of the curve line of thermal resistance with flow rate required to cool the heat source H.

In the gray color area, the cooling capacity of the liquid-cooling module 3 reflected by the thermal resistance variation may change but is considered as acceptable. For example, after the liquid-cooling module 3 operates over a specific period of time (e.g., over a month), the curve line of thermal resistance with flow rate at the first cold plate 21 may turn to $R_{cal,B}$ from $R_{cal,A}$, although $R_{cal,B}$ is still in the gray color area and does not exceed the Rspec, max, the cooling capacity of the liquid-cooling module 3 still decreases over time; in other words, the chart depicted in FIG. 3 may reflect that the first cold plate 21 may have factors that affect the cooling capacity of the liquid-cooling module 3, and the factors may lead to a serious problem over time. Thus, by measuring the thermal resistance $R_{cal,1}$ of the first cold plate 21 in a specific period of time, the control unit 10 is able to determine whether the first cold plate 21 has any possible factor that would affect the cooling capacity before unwanted situation appears.

In step S122, the monitoring and alerting module 1 may determine whether the thermal resistance variation exceeds $R_{spec,\ max}$ or $R_{spec,\ min}$ or has an unusual deviation relative to $R_{spec,\ max}$ and $R_{spec,\ min}$. Either the above cases is spotted, the monitoring and alerting module 1 will determines that the cooling capacity of the liquid-cooling module 3 is in a situation needed to alert the user.

Figure 4:
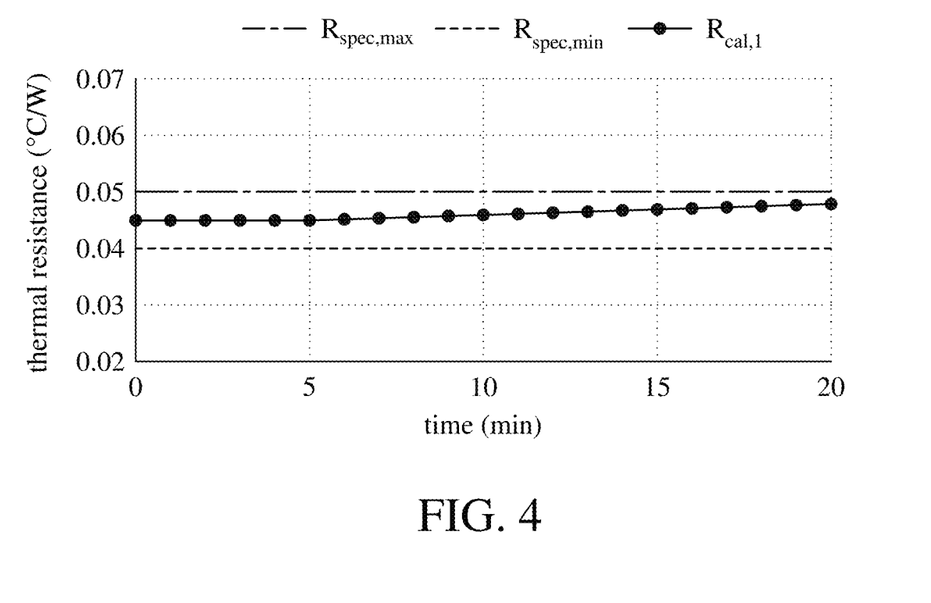
FIG. 4 is a curve chart showing a deviation of the thermal resistance at one of cold plates detected by a monitoring and alerting module according to one embodiment of the disclosure during a period of time.

Referring to FIG. 4, a curve chart showing an unusual deviation of the variation of the thermal resistance $R_{cal,1}$ of the first cold plate 21 in a specific period of time relative to $R_{spec,\ max}$ and $R_{spec,\ min}$ is shown. Specifically, as shown, from 0 to 20 minutes, the thermal resistance $R_{cal,1}$ of the first cold plate 21 does not exceed $R_{spec,\ max}$, but the monitoring and alerting module 1 still finds that the thermal resistance $R_{cal,1}$ gradually increases towards $R_{spec,\ max}$. When the monitoring and alerting module 1 spots the unusual deviation, step S123 is performed to send an alert to user, such that the user will be warned before the deviation leads to a serious problem.

Figure 5:
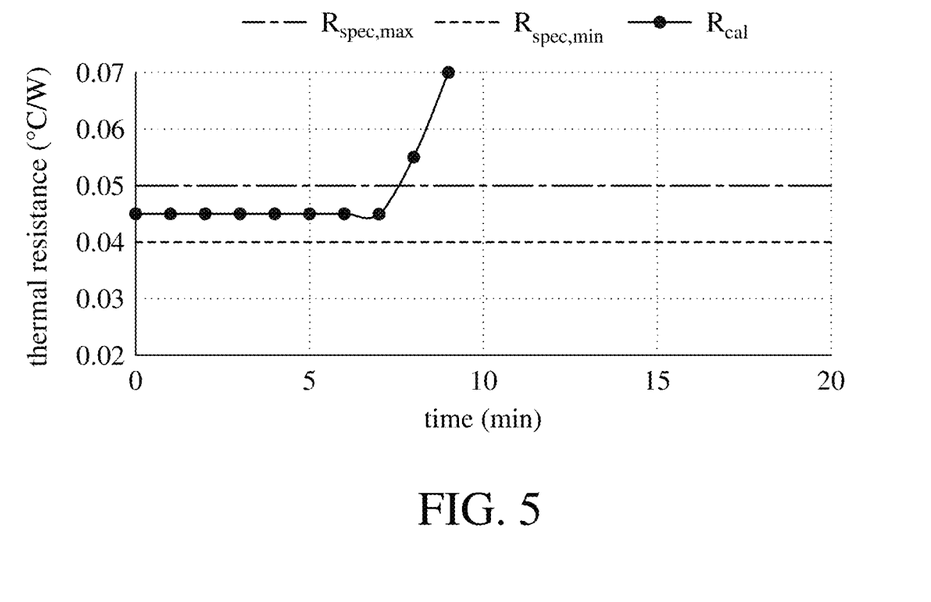
FIG. 5 is a curve chart showing an appearance of thermal resistance at one of cold plates exceeding a predetermined upper limit of thermal resistance detected by a monitoring and alerting module according to one embodiment of the disclosure during a period of time.

Referring to FIG. 5, a curve chart showing that the variation of the thermal resistance $R_{cal,1}$ of the first cold plate 21 in a specific period of time exceeds $R_{spec,\ max}$. Specifically, as shown, there is no unusual deviation of the thermal resistance $R_{cal,1}$ from 0-5 minutes, but the thermal resistance $R_{cal,1}$ exceeds $R_{spec,\ max}$ during the time period of 5 to 10 minutes. When the exceeding of the thermal resistance $R_{cal,1}$ relative to $R_{spec,\ max}$ is determined by the monitoring and alerting module 1, step S123 is performed to send an alert to user.

On the other hand, when the monitoring and alerting module 1 determines that there is no unusual deviation or exceeding of the thermal resistance relative to $R_{spec,\ max}$ and $R_{spec,\ min}$ (or, when the thermal resistance variation does not reflect any situation needed to alert user), step S121 is performed to keep monitoring the thermal resistance.

Further, the monitoring and alerting module 1 is able to monitor the flow rate ratio of the first cold plate 21 and the second cold plate 22. Specifically, the first cold plate 21 and the second cold plate 22 may be different in pressure due to the actual length of tubing connected thereto or the arrangement of tubing, thus the first cold plate 21 and the second cold plate 22 may have different flow rates. The flow rate difference may have an unusual deviation due to the factors, such as tubing damage, presence of debris or impurities accumulation, abnormally bending tube.

Figure 6A:
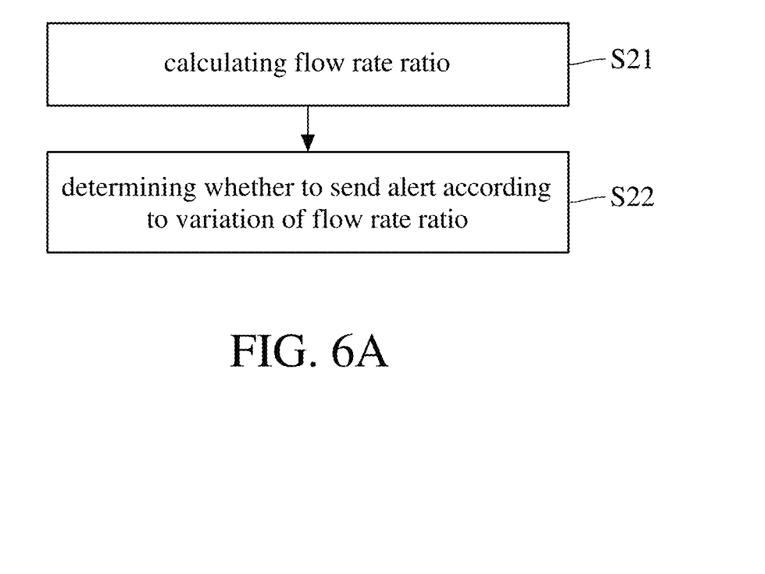
FIGS. 6A-6B are flow charts showing steps of a monitoring and alerting method according to one embodiment of the disclosure that involve flow rate ratio.
Figure 6B:
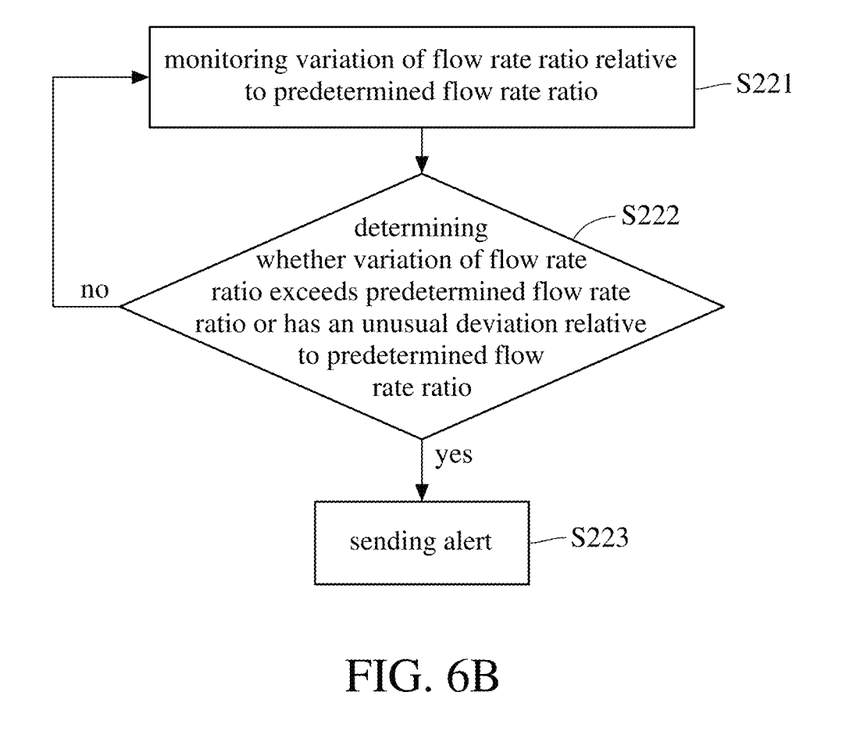

Please refer to FIGS. 6A-6B, flow charts about the steps of the monitoring and alerting method that involve flow rate ratio are provided. As shown, the monitoring and alerting method performed by the control unit 10 may include: S21 (calculating the flow rate ratio of the cold plates) and step S22 (determining whether to send alert according to the variation of flow rate ratio).

Firstly, in step S21, a flow rate ratio $\delta_{cal}$ of the first cold plate 21 and the second cold plate 22 can be expressed as:

$$\delta_{cal} = m_{cal,1}/m_{cal,2}$$

where $m_{cal,1}$ is the mass flowrate of one of the cold plates (e.g., the first cold plate 21), $m_{cal,2}$ is the mass flowrate of the other cold plate (e.g., the second cold plate 22). $m_{cal,1}$ and $m_{cal,2}$ can be expressed as:

$$m_{cal,1} = P_{H,1}/N \times (T_{out,1} - T_{in,1})$$

where $P_{H,1}$ is the power of the heat source H being in thermal contact with the first cold plate 21, N is an user-defined value, $T_{out,1}$ is the temperature of the coolant flowing out of the first cold plate 21 measured by the first outlet thermometer $T1_{out}$, $T_{in,1}$ is the temperature of the coolant flowing into the first cold plate 21 measured by the first inlet thermometer $T1_{in}$.

$m_{cal,2}$ can be expressed as:

$$m_{cal,2} = P_{H,2}/N \times (T_{out,2} - T_{in,2})$$

where $P_{H,2}$ is the power of the heat source H being in thermal contact with the second cold plate 22, N is an user-defined value, $T_{out,2}$ is the temperature of the coolant flowing out of the second cold plate 22 measured by the second outlet thermometer $T2_{out}$, $T_{in,2}$ is the temperature of the coolant flowing into the second cold plate 22 measured by the second inlet thermometer $T2_{in}$.

In addition, a predetermined flow rate ratio $\delta_{spec}$ which is used for determining the variation trend of $\delta_{cal}$ may be provided to the control unit 10 or pre-stored in the control unit 10.

An example is shown in Table 2 below:

TABLE 2

| total flow rate (m1 + m2) | mass flowrate (m1/m2) | predetermined flow rate ratio($\delta_{spec}$) |
|---|---|---|
| 0.012 + 0.008 = 0.02 | 0.012/0.008 = 1.5 | 1.5 |

Specifically shown in FIG. 6B, step S22 may include step S221 (monitoring variation of flow rate ratio relative to the predetermined flow rate ratio $\delta_{spec}$) and step S222 (determining whether variation of flow rate ratio exceeds the predetermined flow rate ratio $\delta_{spec}$ or has an unusual deviation relative to the predetermined flow rate ratio $\delta_{spec}$).

In step S221, the monitoring and alerting module 1 monitors the variation of the flow rate ratio relative to the predetermined flow rate ratio $\delta_{spec}$ so that the monitoring and alerting module 1, in step S222, is able to determine whether there is unusual deviation or exceeding of flow rate ratio $\delta_{cal}$ relative the predetermined flow rate ratio $\delta_{spec}$, thereby capable of determining whether the aforementioned factors that affect the cooling capacity of the liquid-cooling module 3 appear in the first cold plate 21 and the second cold plate 22.

Specifically, the monitoring and alerting module 1 is able to determine whether the flow rate ratio $\delta_{cal}$ exceeds a margin of error of the predetermined flow rate ratio $\delta_{spec}$, and the monitoring and alerting module 1 is able to analyze the variation of the flow rate ratio $\delta_{cal}$ relative to the predetermined flow rate ratio $\delta_{spec}$. The margin of error may be user-determined values when considering factors, such as pumping pressure or variation of flow rate. For example, the margin of error can be defined by $\delta_{spec} \pm P$ %, where P is a user-defined value.

Figure 7:
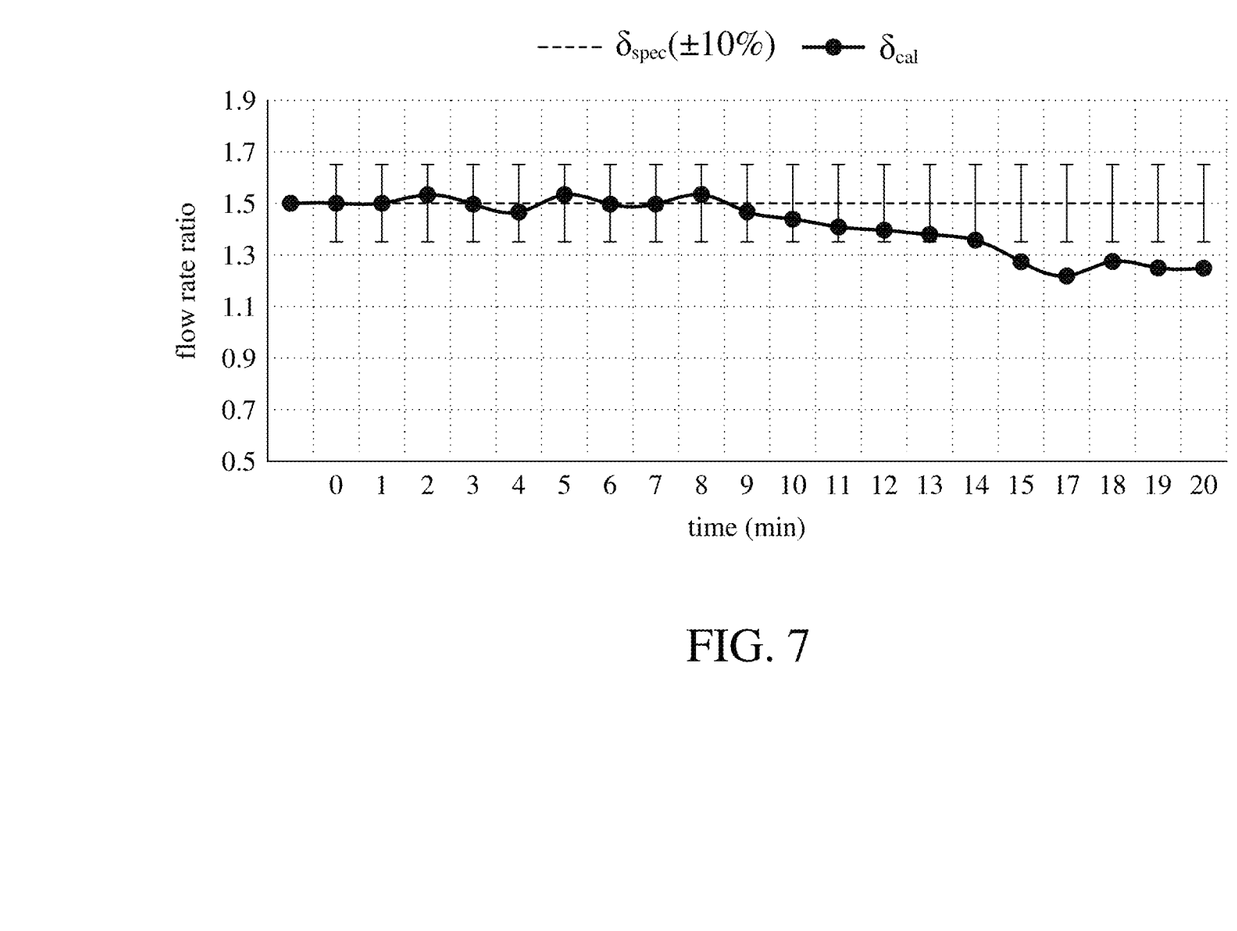
FIG. 7 is a curve chart showing unwanted deviation the flow rate ratio of cold plates detected by a monitoring and alerting module according to one embodiment of the disclosure during a period of time.

For example, a curve chart showing an unusual deviation and an exceeding of the flow rate ratio $\delta_{cal}$ appearing at the first cold plate 21 and the second cold plate 22 is shown in FIG. 7, where the predetermined flow rate ratio $\delta_{spec}$ is, for example, 1.5, and the range of the margin of error is, for example, 1.5±10%. Note that the upper and lower limit and the value of the margin of error are exemplary and may be modified as required.

Specifically, as shown, although the flow rate ratio $\delta_{cal}$ within the time period of 0 to 13 or 14 minutes generally falls within the range of the margin of error, the monitoring and alerting module 1 still notices that the flow rate ratio $\delta_{cal}$ begins to decrease (e.g., gradually decreases) since 9 minutes. According to the trend of the flow rate ratio $\delta_{cal}$, the monitoring and alerting module 1 determines that the flow rate at the first cold plate 21 is decreasing. In response to that, the monitoring and alerting module 1 performs step S223 and sends an alert to the user. This allows the user to aware the flow rate decreasing of the first cold plate 21 as early as possible and thereby allowing the user to have a chance to deal with or solve the factors (e.g., tubing damage, presence of impurities or debris accumulation, or abnormally bending tube) that affects the cooling capacity and flow rate.

In addition, as shown, since 13 or 14 minutes, the flow rate ratio δcal begins to exceed the lower limit of the range of the margin of error, the monitoring and alerting module 1 also will perform step S223 to timely send an alert to user.

When the flow rate ratio $\delta_{cal}$ is increasing (or, gradually increasing), the monitoring and alerting module 1 determines that the flow rate at the second cold plate 22 is decreasing, the monitoring and alerting module 1 also will perform step S223 and sends an alert to the user, allowing user to aware the factors (e.g., tubing damage, presence of impurities or debris accumulation, or abnormally bending tube) that may exit to affect the cooling capacity and flow rate as early as possible.

On the other hand, when the monitoring and alerting module 1 determines that there is no unusual deviation or exceeding of the flow rate ratio $\delta_{cal}$ relative to the predetermined flow rate ratio $\delta_{spec}$, step S221 is performed to keep monitoring the flow rate ratio.

As discussed, through the monitoring and alerting method performed by the monitoring and alerting module 1, the factors which possibly affect the cooling capacity may be determined by monitoring the thermal resistance variation of the selected cold plate, and it is also possible to find out which cold plate exists factors that affect the cooling capacity. Compared to the conventional monitoring systems that only inform user until the temperature of the heat source is detected to be exceeding the threshold value or the leakage already appears, the monitoring and alerting method adopted by the monitoring and alerting module 1 allows alert about the potential problems as early as possible and thereby allowing the user to have a chance to deal with the problems or schedule relevant processes to prevent the liquid-cooling system from accidentally malfunctioning.

Figure 8:
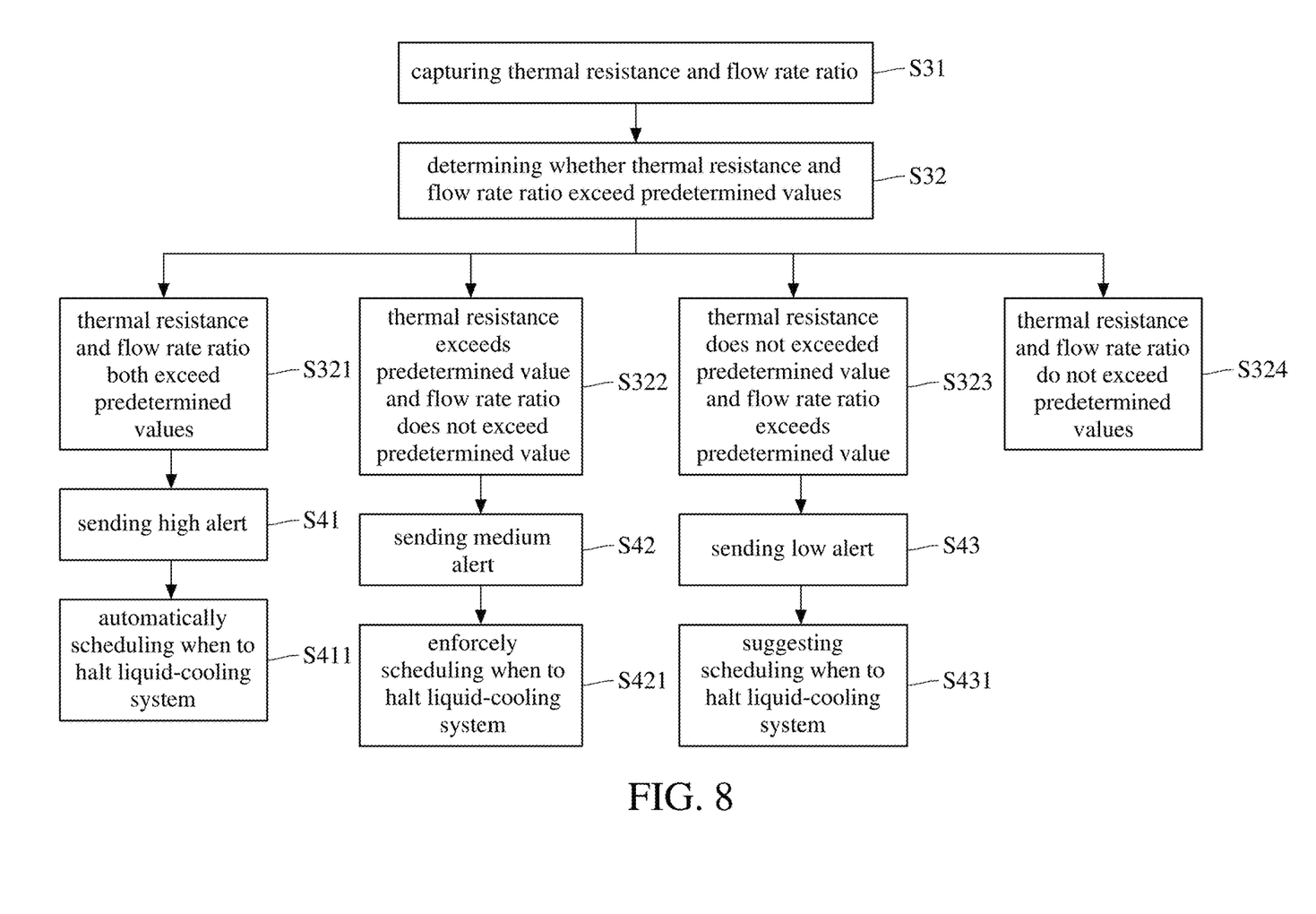
FIG. 8 is a flow chart showing steps of a monitoring and alerting method according to one embodiment of the disclosure that involve alerting situations.

Then, please refer to FIG. 8, which provides a flow chart of steps of the monitoring and alerting method performed by the monitoring and alerting module 1 to determine the type of alert to be provided to user. As shown, the monitoring and alerting method may further include: step S31 (capturing thermal resistance and flow rate ratio) and step S32 (determining whether thermal resistance and flow rate ratio exceed predetermined values).

Firstly, in step S31, the monitoring and alerting module 1 may obtain a thermal resistance $R_{cal}$ of a cold plate (e.g., as discussed above, the thermal resistance $R_{cal,1}$ of the first cold plate 21 or the thermal resistance $R_{cal,2}$ of the second cold plate 22) and may obtain the flow rate ratio $\delta_{cal}$ of the first cold plate 21 and the second cold plate 22.

Then, in step S32, the monitoring and alerting module 1 is able to determine whether the thermal resistance $R_{cal,1}$ of the first cold plate 21 and the thermal resistance $R_{cal,2}$ of the second cold plate 22 exceed the predetermined upper limit of thermal resistance $R_{spec,\,max}$ and the predetermined lower limit of thermal resistance $R_{spec,\,min}$ and whether the flow rate ratio $\delta_{cal}$ of the first cold plate 21 and the second cold plate 22 exceed the predetermined flow rate ratio $\delta_{spec}$.

In step S321, when the monitoring and alerting module 1 determines that the thermal resistance $R_{cal}$ and the flow rate ratio $\delta_{cal}$ both exceed the predetermined values, a step S41 is performed. In step S41, the monitoring and alerting module 1 sends a high alert to user. Optionally, a step S411 is performed; in step S411, the monitoring and alerting module 1 may automatically schedule when to halt the liquid-cooling module 3.

In step S322, when the monitoring and alerting module 1 determines that the flow rate ratio $\delta_{cal}$ does not exceed the predetermined value and the thermal resistance $R_{cal}$ exceeds the predetermined value, a step S42 is performed. In step S42, the monitoring and alerting module 1 sends a medium alert to user. Optionally, in step S42, the monitoring and alerting module 1 may also point out that one of the cold plates exists problems. Optionally, a step S421 is performed; in step S421, the monitoring and alerting module 1 may enforcely schedule when to halt the liquid-cooling module 3.

In step S323, when the monitoring and alerting module 1 determines that the thermal resistance $R_{cal}$ does not exceed the predetermined value and the flow rate ratio $\delta_{cal}$ exceeds the predetermined value, a step S43 is performed. In step S43, the monitoring and alerting module 1 sends a low alert to user. Optionally, in step S43, the monitoring and alerting module 1 may also point out that the tubing of the liquid-cooling module 3 exists problems. Optionally, a step S431, is performed; in step S431, the monitoring and alerting module 1 may suggest scheduling when to halt the liquid-cooling module 3.

In step S324, when the monitoring and alerting module 1 determines that the thermal resistance $R_{cal}$ and the flow rate ratio $\delta_{cal}$ do not exceed the predetermined values, the step S31 is performed to keep monitoring the thermal resistance $R_{cal}$ and the flow rate ratio $\delta_{cal}$. Note that the processes after the emitting of alert information to user are exemplary and may be changed as required.

Figure 9:
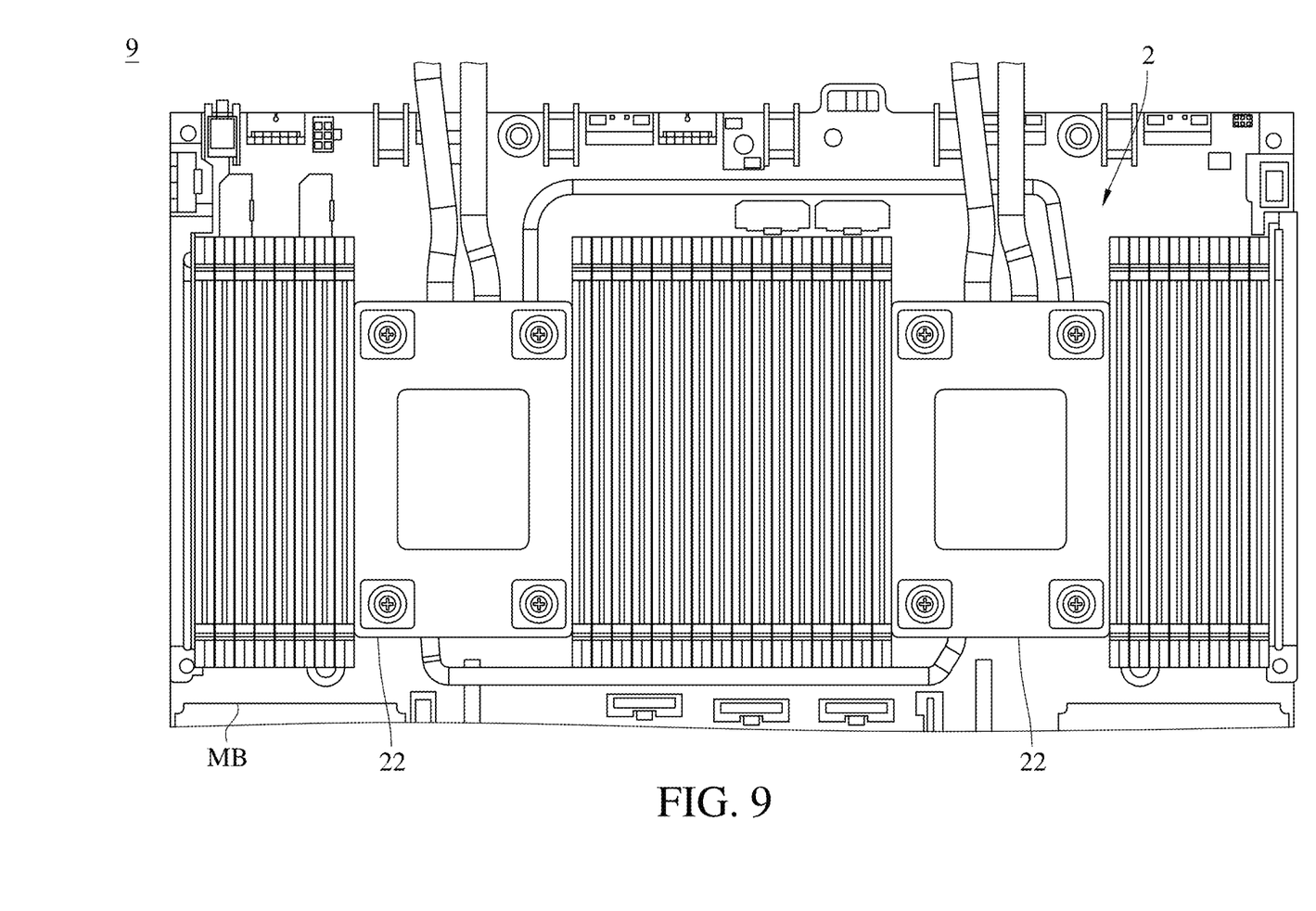
FIG. 9 is a partially enlarged planar view of an electronic device which adopts a liquid-cooling module according to one embodiment of the disclosure.

In addition, please refer to FIG. 9, a liquid-cooling module 2 according to one embodiment of the disclosure which is applicable to the electronic device 9 is provided. As shown, the liquid-cooling module 2 is able to cool the heat source on the circuit board MB by the first cold plate 21 and the second cold plate 22, and the liquid-cooling module 2 is also able to reflect the aforementioned factors that affect the cooling capacity using the aforementioned monitoring and alerting module.

According to the liquid-cooling systems, the monitoring and alerting methods, and the electronic devices as discussed in the above embodiments of the disclosure, the factors which possibly affect the cooling capacity may be determined by monitoring the thermal resistance variation of the selected cold plate, and it is also possible to find out which cold plate exists factors that affect the cooling capacity.

Compared to the conventional monitoring systems that only inform user until the temperature of the heat source is detected to be exceeding the threshold value or the leakage already appears, the monitoring and alerting method adopted by the monitoring and alerting module allows alert about the potential problems as early as possible and thereby allowing the user to have a chance to deal with the problems or schedule relevant processes to prevent the liquid-cooling system from accidentally malfunctioning.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A monitoring and alerting method for a liquid-cooling system, comprising:
    monitoring a thermal resistance variation of at least one cold plate of the liquid-cooling system;
    sending an alert related to the thermal resistance variation;
    calculating a flow rate ratio of the at least one cold plate; and
    determining whether to send an alert according to a variation of the flow rate ratio.

2. The monitoring and alerting method according to claim 1, wherein monitoring the thermal resistance variation comprises:
    measuring the thermal resistance variation of the at least one cold plate relative to a predetermined upper limit of thermal resistance and a predetermined lower limit of thermal resistance; and
    determining a type of the alert related to the thermal resistance variation.

3. The monitoring and alerting method according to claim 2, wherein the thermal resistance denotes to $R_{cal}$, a temperature of a heat source in thermal contact with the at least one cold plate denotes to $T_H$, an inlet temperature of the at least one cold plate denotes to $T_{in}$, a power of the heat source in thermal contact with the at least one cold plate denotes to $P_H$, and the following condition is satisfied:

$$R_{cal}=(T_H-T_{in})/P_H.$$

4. The monitoring and alerting method according to claim 2, wherein the predetermined upper limit of thermal resistance denotes to $R_{spec,\,max}$, the predetermined lower limit of thermal resistance denotes to $R_{spec,\,min}$, and the following conditions are satisfied:
    $R_{spec,\,max}=\alpha_{max} \times Q^{\hat{}}\beta_{max}$, where $\alpha_{max}$ and $\beta_{max}$ are user-defined values, Q is a coolant flow rate; and
    $R_{spec,\,min}=\alpha_{min} \times Q^{\hat{}}\beta_{min}$, where $\alpha_{min}$ and $\beta_{min}$ are user-defined values.

5. The monitoring and alerting method according to claim 2, wherein determining the type of the alert related to the thermal resistance variation comprises:
    when the thermal resistance variation is determined to be exceeding the predetermined upper limit of thermal resistance or the predetermined lower limit of thermal resistance or having an unusual deviation relative to the predetermined upper limit of thermal resistance and the predetermined lower limit of thermal resistance, sending an alert is performed.

6. The monitoring and alerting method according to claim 2, wherein sending the alert related to the thermal resistance variation comprises:
when the thermal resistance variation is determined to be not exceeding the predetermined upper limit of thermal resistance and the predetermined lower limit of thermal resistance or to have no unusual deviation relative to the predetermined upper limit of thermal resistance and the predetermined lower limit of thermal resistance, measuring the thermal resistance variation relative to the predetermined upper limit of thermal resistance and the predetermined lower limit of thermal resistance is performed.

7. The monitoring and alerting method according to claim 1, wherein determining whether to send the alert according to the variation of the flow rate ratio comprises:
measuring the variation of the flow rate ratio relative to a predetermined flow rate ratio; and
determining whether to alert about the variation of the flow rate ratio by a relationship between the variation of the flow rate ratio and the predetermined flow rate ratio.

8. The monitoring and alerting method according to claim 7, wherein the flow rate ratio denotes to $\delta_{cal}$, a mass flowrate of one of the at least one cold plate denotes to $m_{cal,1}$, a mass flowrate of another one of the at least one cold plate denotes to $m_{cal,2}$, and the following condition is satisfied:

$$\delta_{cal} = m_{cal,1}/m_{cal,2}.$$

9. The monitoring and alerting method according to claim 7, wherein determining whether to alert about the variation of the flow rate ratio comprises:
when the flow rate ratio is determined to be exceeding the predetermined flow rate ratio or having an unusual deviation relative to the predetermined flow rate ratio, sending the alert according to the variation of the flow rate ratio is performed.

10. The monitoring and alerting method according to claim 7, wherein the at least one cold plate comprises a first cold plate and a second cold plate, a mass flowrate of the first cold plate denotes to $m_{cal,1}$, a mass flowrate of the second cold plate denotes to $m_{cal,2}$, and determining whether to alert about the variation of the flow rate ratio comprises:
when the flow rate ratio decreases, a flow rate of the first cold plate is determined to be decreasing; and
when the flow rate ratio decreases, a flow rate of the second cold plate is determined to be decreasing.

11. The monitoring and alerting method according to claim 7, further comprising:
capturing the thermal resistance and the flow rate ratio; and
determining whether the thermal resistance and the flow rate ratio exceed predetermined values.

12. The monitoring and alerting method according to claim 11, further comprising:
when both the thermal resistance and the flow rate ratio are determined to be exceeding the predetermined values, sending a high alert is performed.

13. The monitoring and alerting method according to claim 12, wherein sending the high alert comprises:
automatically scheduling when to halt the liquid-cooling system.

14. The monitoring and alerting method according to claim 11, further comprising:
when the thermal resistance is determined to be exceeding a predetermined value and the flow rate ratio is determined to be not exceeding a predetermined value, sending a medium alert is performed.

15. The monitoring and alerting method according to claim 14, wherein sending the medium alert comprises:
enforcely scheduling when to halt the liquid-cooling system.

16. The monitoring and alerting method according to claim 11, further comprising:
when the thermal resistance is determined to be not exceeding a predetermined value and the flow rate ratio is determined to be exceeding a predetermined value, sending a low alert is performed.

17. The monitoring and alerting method according to claim 16, wherein sending the low alert comprises:
suggesting scheduling when to halt the liquid-cooling system.

18. The monitoring and alerting method according to claim 11, further comprising:
when both the thermal resistance and the flow rate ratio are determined to be not exceeding the predetermined values, capturing the thermal resistance and the flow rate ratio is performed.

19. A liquid-cooling system comprising:
a liquid-cooling module comprising at least one cold plate; and
a monitoring and alerting module comprising:
a control unit;
a first inlet thermometer in communication with the control unit for measuring a temperature of a liquid inlet of the at least one cold plate; and
a first heat source thermometer in communication with the control unit for measuring a temperature of at least one heat source in thermal contact with the at least one cold plate;
where the control unit produces an alert according to a thermal resistance variation calculated by the first inlet thermometer, the first heat source thermometer, and a power of the at least one heat source;
wherein the at least one cold plate of the liquid-cooling module comprises a first cold plate and a second cold plate, the control unit produces an alert according to a variation of a flow rate ratio between the first cold plate and the second cold plate.

20. An electronic device comprising:
a circuit board;
at least one heat source disposed on the circuit board;
a liquid-cooling module comprising at least one cold plate in thermal contact with the at least one heat source; and
a monitoring and alerting module comprising:
a control unit electrically connected to the circuit board;
a first inlet thermometer in communication with the control unit for measuring a temperature of a liquid inlet of the at least one cold plate; and
a first heat source thermometer in communication with the control unit for measuring a temperature of the at least one heat source;
wherein the control unit produces an alert according to a thermal resistance variation calculated by the first inlet thermometer, the first heat source thermometer, and a power of the at least one heat source;
wherein the at least one cold plate of the liquid-cooling module comprises a first cold plate and a second cold plate, the control unit produces an alert according to a variation of a flow rate ratio between the first cold plate and the second cold plate.

* * * * *